(12) United States Patent
Delzer

(10) Patent No.: US 7,388,441 B2
(45) Date of Patent: Jun. 17, 2008

(54) ROBUST PHASE-LOCK DETECTOR

(75) Inventor: Donald J. Delzer, Beaverton, OR (US)

(73) Assignee: Tektronix. Inc., Beaverton, OR (US)

( * ) Notice: Subject to any disclaimer, the term of this patent is extended or adjusted under 35 U.S.C. 154(b) by 167 days.

(21) Appl. No.: 11/439,724

(22) Filed: May 23, 2006

(65) Prior Publication Data

US 2007/0285182 A1    Dec. 13, 2007

(51) Int. Cl.
*H03L 7/95* (2006.01)
(52) U.S. Cl. .................. 331/25; 331/DIG. 2; 327/156
(58) Field of Classification Search .................. 331/25, 331/DIG. 2; 327/156
See application file for complete search history.

(56) References Cited

U.S. PATENT DOCUMENTS 6,314,150 B1 * 11/2001 Vowe ......................... 375/374

6,396,354 B1 * 5/2002 Murayama et al. ........... 331/17

* cited by examiner

*Primary Examiner*—Benny Lee
*Assistant Examiner*—James E Goodley
(74) *Attorney, Agent, or Firm*—Francis I. Gray

(57) ABSTRACT

A robust phase-lock detector for a phase-locked loop examines both the sum frequency and baseband components of an error signal from the phase-locked loop to determine that both a reference signal and an output signal for the phase-locked loop are present and that the reference and output signals have a desired phase relationship. An IF detector selects the sum frequency component, which is the sum of the reference frequency and a subdivided frequency from the output signal, and detects its presence. A baseband detector selects the baseband component and detects whether the baseband component is approximately zero volts. The outputs from the IF detector and the baseband detector are combined to produce a lock signal, indicating that the phase-locked loop is locked, i.e., the reference and output signals are present and have the desired phase relationship with respect to each other.

13 Claims, 2 Drawing Sheets

ROBUST PHASE-LOCK DETECTOR

BACKGROUND OF THE INVENTION

The present invention relates to phase-locked loops, and more particular to a robust phase-lock detector for indicating when a phase-locked loop (PLL) is locked.

A phase-locked loop provides an output signal that has a desired phase relationship with a reference signal, although generally at a different frequency. The output signal frequency usually is some multiple of the frequency of the reference signal, i.e., $f_{out}=(N/m)f_{ref}$ or, if the PLL is fractional-N, $f_{out}=Nf_{ref}+(k/m)f_{ref}$ where N, m and k are integers. Typically the output signal is subdivided in frequency and the subdivided frequency signal is compared with the reference signal in a phase/frequency detector, producing an error signal indicative of the relative phase differential between the two signals—in this case $f_{out}=(N/m)f_{ref}$ as the most common type. The error signal is filtered by a loop filter and then used to control the phase/frequency of an oscillator to produce the output signal.

It is desirable to build phase-locked loops that have an indicator that tells a user or an electronic controller when phase lock is acquired, i.e., the reference and output signals have the desired phase relationship between them. A digital phase-locked loop is relatively cheap and easy to implement. The error signal is in the form of pulses or variations from a standard duty cycle. The absence of pulses or the presence of the standard duty cycle is used to indicate that the digital phase-locked loop is locked. Although the digital phase-locked loop is pretty good most of the time, it has poor noise performance which may produce spurious pulses or baseband anomalies. Therefore analog phase-locked loops are generally used where greater precision is required.

When a linear analog multiplier, such as a mixer or a Gilbert gain cell, is used as the phase detector in an analog phase-locked loop, typical lock detectors have problems being robust. Generally the error signal at the output of the detector is steered to zero volts d.c. by an integrating amplifier that follows the phase detector. A window detector monitors the d.c. voltage at the phase detector output and indicates when the phase deviates outside of a range specified for phase lock. The locked condition at the input of the window detector is zero volts d.c., plus or minus a small error voltage. The problem with the window detector is that other situations cause the phase detector output to be zero volts d.c. even when the phase-locked loop is not locked. For example when either or both of the signals are removed from the inputs of the phase detector, the output is zero volts d.c., but the phase-locked loop is not locked. This situation occurs when a part of the circuit is broken or either signal is powered "off." In this case the window detector output indicates a "false" phase lock condition.

What is desired is a robust phase-lock detector for a phase-locked loop that minimizes false lock indications.

BRIEF SUMMARY OF THE INVENTION

Accordingly the present invention provides a robust phase-lock detector that examines both the sum frequency ($\omega1+\omega2$) and baseband ($\omega1-\omega2$) components of an error signal from a phase-locked loop phase detector to determine that both a reference signal and an output signal for the phase-locked loop are present and that the reference and output signals have a desired phase relationship. A sum frequency component detector may have a sum filter, either a bandpass or highpass, at the input to reject the difference frequency component of the error signal and pass the sum frequency component. An IF detector detects the sum frequency component to determine that both the reference and output signals are present and provides a positive output. If only one or none of the reference and output signals are present, the IF detector provides a negative output. A lowpass filter selects the baseband component and a windowed comparator detects whether the baseband component is approximately zero volts to provide a positive output. The outputs from the IF detector and the windowed comparator are combined to produce a lock signal, indicating that the phase-locked loop is locked, i.e., the reference and output signals have the desired phase relationship with respect to each other.

The objects, advantages and other novel features of the present invention are apparent from the following detailed description when read in conjunction with the appended claims and attached drawing.

DETAILED DESCRIPTION OF THE INVENTION

Figure 1:
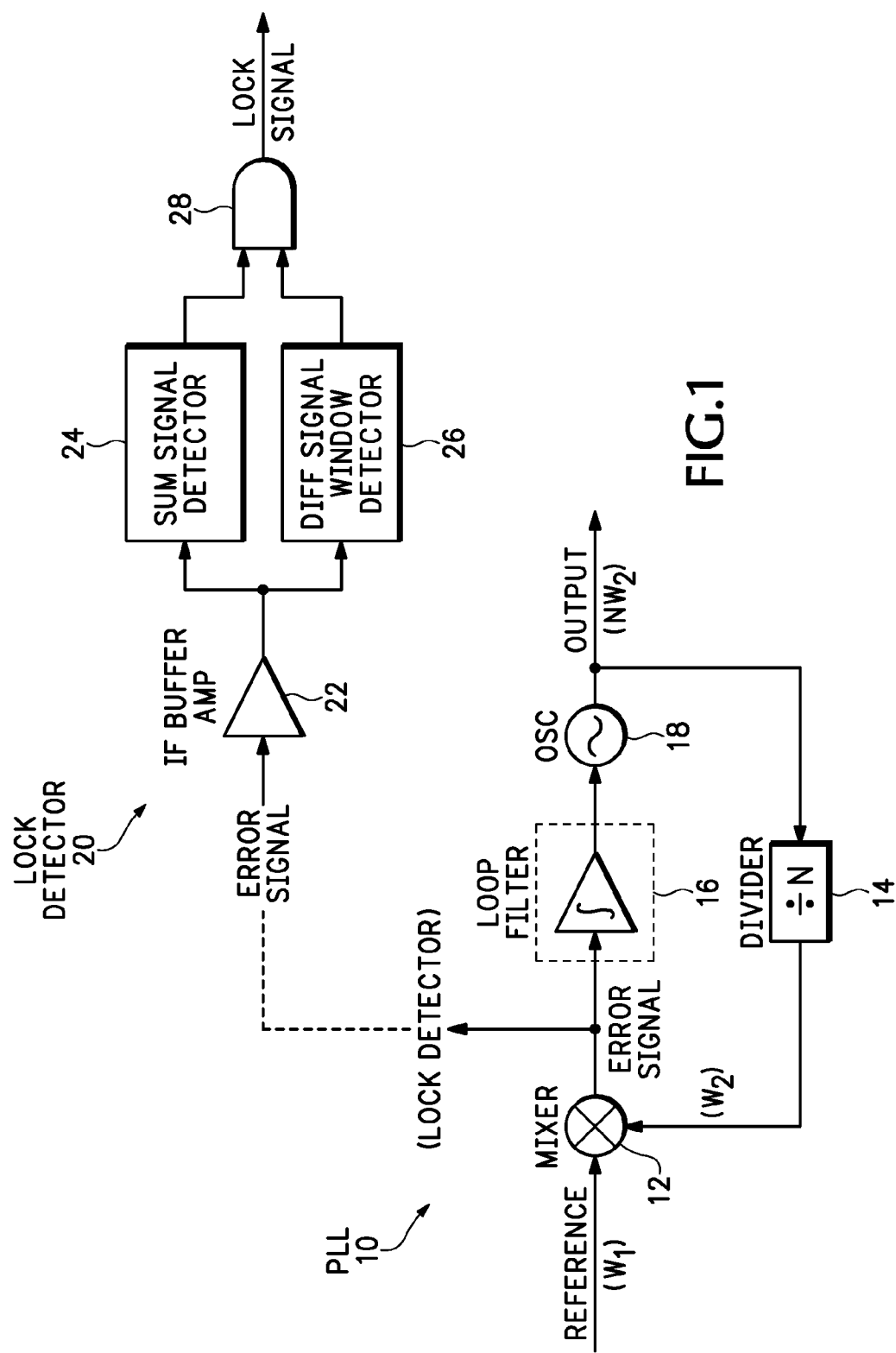
FIG. 1 is a block diagram view of a phase-locked loop having a robust phase-lock detector according to the present invention.

Referring now to the FIG. 1 a conventional analog phase-locked loop (PLL) 10 having a phase/frequency detector 12 in the form of a frequency mixer for comparing a reference signal, $\omega1$, with a subdivided output signal, $\omega2$, from a frequency divider 14. The mixer 12 provides an error signal as an output that is input to a loop filter 16, shown in this instance as an integrating amplifier, to produce a control signal for a voltage controlled oscillator (VCO) 18. The output signal, $N\omega2$, from the VCO 18 is input to the frequency divider 14 to complete the phase-locked loop. The error signal is also input to a lock detector 20 to produce a lock signal when the phase-locked loop is locked.

The lock detector 20 has an input buffer amplifier 22 that passes the sum ($\omega1+\omega2$) and difference or baseband ($\omega1-\omega2$) frequency components of the error signal from the mixer 12. The output from the buffer amplifier 22 is input to a sum signal detector 24 and a windowed baseband (difference) signal detector 26. The outputs from the sum and baseband detectors 24, 26 are input to a logic gate 28 to produce a lock signal that is used to drive some visual indicator, such as a light emitting diode (LED) on the front panel of an instrument, or otherwise indicate whether the PLL 10 is locked.

Figure 2:
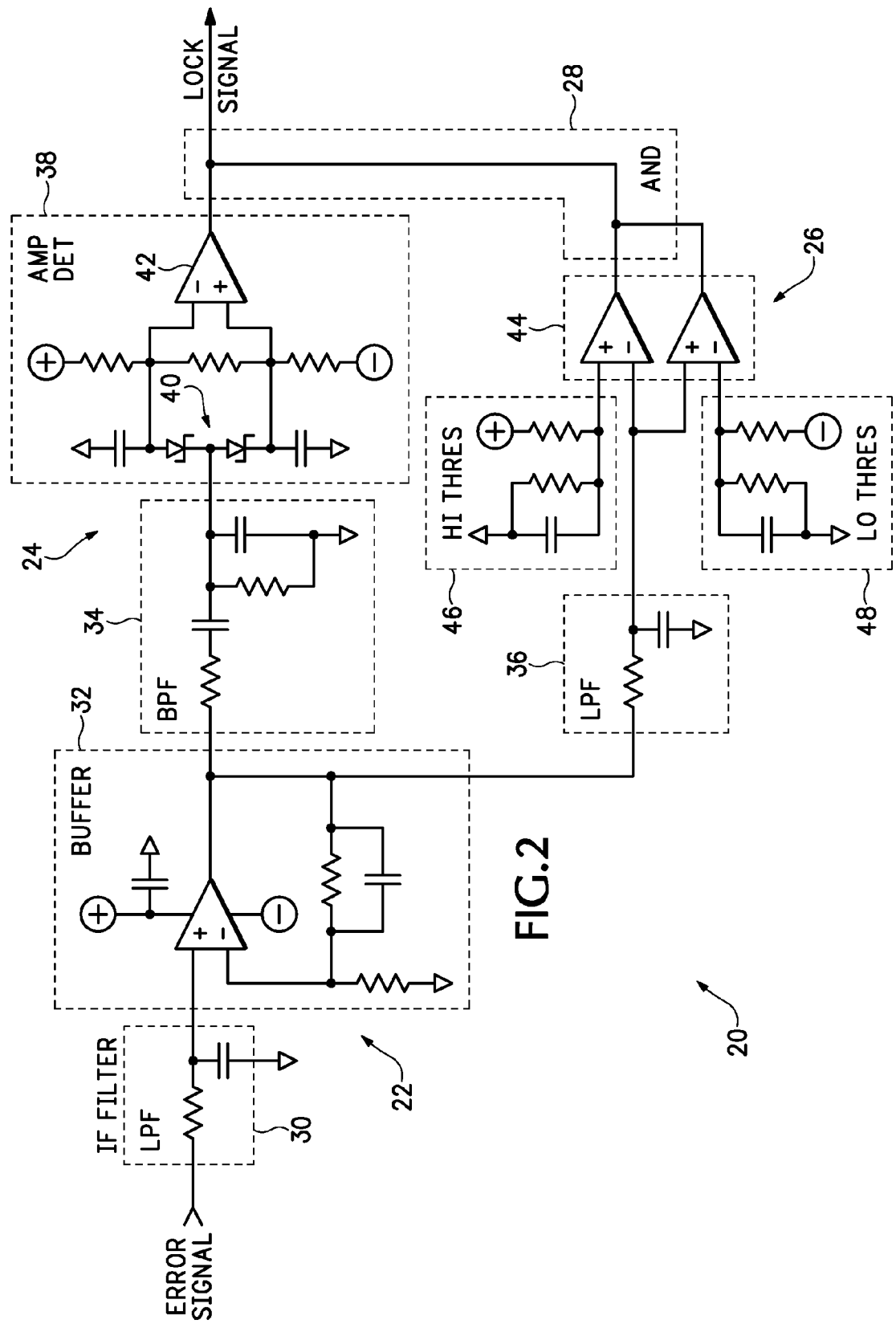
FIG. 2 is a schematic diagram view of the robust phase-lock detector according to the present invention.

As shown in FIG. 2 the error signal is initially input to an IF lowpass filter 30 to eliminate high frequencies, such as distortion products, above the sum of the reference frequency and subdivided output frequency. For the present example to assist in understanding the operation, the output signal from the oscillator 18 has a frequency of 100 MHz ($N\omega2$), the reference signal has a frequency of 10 MHz ($\omega1$) and the divisor of the frequency divider 14 is ten. Therefore the sum frequency component of the error signal is approximately 20 MHz ($\omega1+\omega2$) and the difference component is approximately d.c. The filtered error signal from the IF lowpass filter 30 is input to a buffer amplifier 32, and the buffered error signal from the buffer amplifier is input to a sum filter 34 and to a baseband lowpass filter 36. The sum filter 34, which is shown as a bandpass filter but also may be a highpass filter, passes the sum frequency component of the buffered error signal, i.e., 20 MHz, to an IF sum signal presence detector 38. If both the reference and output signals are present, then there is an IF signal input to the IF sum signal presence detector 38 having a significant or large detected amplitude (proportional to the amplitudes of the reference and subdivided output signals), as detected by a rectifier 40 within the IF sum signal presence detector. If either the reference or output signals are missing, then there is no sum component signal that passes the sum filter 34. Since ideally a multiplier having no input on one input produces no output, the sum filter 34 may be omitted. However practically there may be some leakage of one of the signals through the mixer 12 when the other signal is absent, although the amplitude of the leakage signal is relatively insignificant or small. If the sum filter 34 is a bandpass filter, even this leakage signal may be rejected prior to the rectifier 40. Therefore at the output of a differential amplifier 42 coupled to the output of the rectifier 40 the sum detector 24 indicates whether or not both the reference and output signals are present.

The output from the lowpass filter 36, such as one which passes the baseband component of the error signal (28 kHz cutoff in this example), is input to a window comparator 44 for comparison with both a positive voltage close to zero volts from a HI threshold circuit 46 and a negative voltage close to zero volts from a LO threshold circuit 48. If the baseband error signal component is close to zero, i.e., within +/−0.39 volts for this example to provide a noise margin, then the window comparator 44 provides a positive output. The output from the window comparator 44 and the IF signal presence detector 38 are input to the logic gate 28, such as the wired AND gate shown, so that the lock signal is generated when both reference and output signals are present and the baseband error signal component is approximately zero volts.

Although a particular embodiment is described with respect to FIGS. 1 and 2, other circuits may be used to detect from the error signal the presence of both reference and input signals for appropriate logical combination with the output from the windowed comparator Thus the present invention provides a robust phase-lock detector for a PLL by using the sum component of the error signal to detect the presence of both the reference and output signals in addition to detecting when the baseband error voltage is approximately zero.

What is claimed is:

1. A phase-lock detector for a phase-locked loop comprising:
   a sum frequency component detector coupled to receive an error signal from the phase-locked loop to generate a first lock component when both a reference signal input to the phase-locked loop and an output signal from the phase-locked loop are present;
   a baseband detector coupled to receive the error signal to generate a second lock component when a baseband component of the error signal is approximately zero volts; and
   a logic circuit coupled to combine the first and second lock components to generate a lock signal when the phase-locked loop is locked.

2. The detector as recited in claim 1 wherein the logic circuit comprises an AND gate having the first and second lock components as inputs and providing the lock signal as an output.

3. The detector as recited in claim 1 wherein the sum frequency component detector comprises an IF sum frequency detector having a sum frequency component of the error signal as an input and providing the first lock component as an output.

4. The detector as recited in claim 3 wherein the sum frequency component detector further comprises a sum filter having the error signal as an input and having the sum frequency component of the error signal as an output when both the reference and output signals are present.

5. The detector as recited in claim 4 wherein the sum filter comprises a bandpass filter.

6. The detector as recited in claim 4 wherein the sum filter comprises a highpass filter.

7. The detector as recited in claim 1 wherein the baseband detector comprises:
   a baseband filter having the error signal as an input and providing a baseband component of the error signal as an output; and
   means coupled to the output of the baseband filter for comparing the baseband component with a voltage window around zero volts to provide the second lock component when the baseband component is approximately zero volts.

8. A method of phase-lock detection for a phase-locked loop comprising the steps of:
   detecting the presence of a sum frequency component of an error signal from the phase-locked loop to generate a first lock component;
   determining when a baseband component of the error signal is approximately zero volts to produce a second lock component; and
   combining the first and second lock components to form a lock signal indicating that the phase-locked loop is locked.

9. The method as recited in claim 8 wherein the detecting step comprises the step of detecting that the sum frequency component is present using an IF sum frequency detector to generate the first lock component.

10. The method as recited in claim 9 wherein the detecting step further comprises the step of filtering the error signal to select the sum frequency component prior to input to the IF detector.

11. The method as recited in claim 8 wherein the determining step comprises the steps of:
    filtering the error signal to select the baseband component; and
    comparing the baseband component with a threshold to generate the second lock component.

12. The method as recited in claim 11 wherein the threshold comprises a windowed threshold around zero volts to provide a noise margin.

13. An apparatus for detecting phase lock in a phase-locked loop comprising:
    means for detecting when a sum frequency component of an error signal from the phase-locked loop is present to produce a first lock component;
    means for determining when a baseband component of the error signal is approximately zero volts to produce a first lock component; and
    means for combining the first and second lock components to produce a lock signal when a reference signal and an output signal that produce the sum frequency component from the phase-locked loop are present and the baseband component is approximately zero volts.

* * * * *